United States Patent
Chang et al.

(10) Patent No.: US 10,587,191 B2
(45) Date of Patent: Mar. 10, 2020

(54) DC-DC CONVERTING CIRCUIT AND METHOD FOR CONTROLLING THE SAME

(71) Applicant: uPI Semiconductor Corp., Hsinchu County (TW)

(72) Inventors: Chih-Lien Chang, Hsinchu County (TW); Min-Rui Lai, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 16/262,917

(22) Filed: Jan. 31, 2019

(65) Prior Publication Data

US 2019/0356223 A1 Nov. 21, 2019

(30) Foreign Application Priority Data

May 16, 2018 (TW) .............................. 107116626 A

(51) Int. Cl.
*H02M 3/156* (2006.01)
*H03K 5/24* (2006.01)
*H02M 1/00* (2006.01)

(52) U.S. Cl.
CPC .............. *H02M 3/156* (2013.01); *H03K 5/24* (2013.01); *H02M 2001/0009* (2013.01)

(58) Field of Classification Search
CPC .... H02M 3/155–3/158; H02M 3/1584; H02M 3/1588; H02M 2001/0009; H03K 5/24; Y02B 70/1466
USPC .......................................... 323/271, 284, 285
See application file for complete search history.

(56) References Cited

U.S. PATENT DOCUMENTS

| | | | |
|---|---|---|---|
| 6,396,252 B1* | 5/2002 | Culpepper | H02M 3/156 323/225 |
| 7,298,124 B2 | 11/2007 | Kan et al. | |
| 7,777,469 B2 | 8/2010 | Nguyen | |
| 7,928,670 B2* | 4/2011 | Chen | H05B 33/0815 315/159 |
| 8,253,407 B2 | 8/2012 | Chen, et al. | |
| 8,786,270 B2 | 7/2014 | Wu et al. | |
| 9,735,674 B2 | 8/2017 | Zarkhin | |
| 9,841,776 B1 | 12/2017 | Bari et al. | |
| 2011/0018516 A1* | 1/2011 | Notman | H02M 3/1588 323/284 |
| 2015/0137776 A1* | 5/2015 | Thomas | H02M 3/1588 323/271 |

* cited by examiner

*Primary Examiner* — Yemane Mehari
(74) *Attorney, Agent, or Firm* — JCIPRNET

(57) ABSTRACT

A dc-dc converting circuit and a method for controlling the same are provided. The dc-dc converting circuit includes an output stage, a mode detection circuit, a PWM signal generating circuit and a ramp signal generating circuit. The output stage provides an output voltage. The mode detection circuit provides a mode detection signal. The PWM generating circuit provides a time signal to the output stage. When the dc-dc converting circuit enters a continuous conduction mode from a discontinuous conduction mode, the ramp signal generating circuit provides a second ramp signal to the PWM signal generating circuit in a preset time according to the mode detection signal. The ramp signal generating circuit provides a first ramp signal to the PWM signal generating circuit after the preset time. A slope of the second ramp signal is greater than a slope of the first ramp signal.

10 Claims, 10 Drawing Sheets

DC-DC CONVERTING CIRCUIT AND METHOD FOR CONTROLLING THE SAME

CROSS REFERENCE TO RELATED APPLICATION

This application claims the priority benefit of Taiwan application serial no. 107116626, filed on May 16, 2018. The entirety of the above-mentioned patent application is hereby incorporated by reference herein and made a part of specification.

BACKGROUND OF THE INVENTION

1. Field of the Invention

The invention relates to a power circuit, and more particularly, relates to a dc-dc converting circuit and a method for controlling the same.

2. Description of Related Art

In general, the dc-dc converting circuit at light loading will enter a discontinuous conduction mode (DCM) from a continuous conduction mode (CCM) to improve its own power conversion efficiency. When the dc-dc converting circuit enters the continuous conduction mode from the discontinuous conduction mode, it will take a period of time for the output to reach a stable state. In addition, an output voltage undershoot will also occur during this period of time.

SUMMARY OF THE INVENTION

Accordingly, the invention provides a dc-dc converting circuit and a method for controlling the same. When the dc-dc converting circuit enters the continuous conduction mode from the discontinuous conduction mode, the time for the output voltage to be stable is shortened and undershoot of the output voltage is reduced.

The dc-dc converting circuit of the invention includes an output stage, a mode detection circuit, a PWM signal generating circuit and a ramp signal generating circuit. The output stage provides an output voltage. The mode detection circuit is coupled to the output stage, and provides a mode detection signal. The PWM signal generating circuit is coupled to the output stage, and provides a time signal to the output stage. The ramp signal generating circuit is coupled to the PWM signal generating circuit and the mode detection circuit, and provides a first ramp signal or a second ramp signal to the PWM signal generating circuit. When the dc-dc converting circuit enters a continuous conduction mode from a discontinuous conduction mode, the ramp signal generating circuit provides a second ramp signal to the PWM signal generating circuit in a preset time according to the mode detection signal. The ramp signal generating circuit provides a first ramp signal to the PWM signal generating circuit after the preset time. A slope of the second ramp signal is greater than a slope of the first ramp signal.

In an embodiment of the invention, the PWM signal generating circuit includes a comparator and an on-time signal generator. The comparator is coupled to the ramp signal generating circuit, and receives an error signal and the first ramp signal or the second ramp signal to generate a trigger signal. The on-time signal generator is coupled to the comparator, and generates the time signal according to the trigger signal.

In an embodiment of the invention, when the dc-dc converting circuit operates in the discontinuous conduction mode, the ramp signal generating circuit stops providing the first ramp signal and the second ramp signal.

In an embodiment of the invention, the ramp signal generating circuit includes a control circuit and a ramp signal generator. The control circuit is coupled to the mode detection circuit, and generates a control signal in response to the mode detection signal. The ramp signal generator is coupled to the mode detection circuit and the control circuit, and generates the second ramp signal in response to the mode detection signal and the control signal.

In an embodiment of the invention, the control circuit includes a counter. The counter is coupled to the PWM signal generating circuit to receive the time signal. After the dc-dc converting circuit enters the continuous conduction mode from the discontinuous conduction mode, the counter counts a number of pulse waves of the time signal to determine the preset time, and after the number of pulse waves is equal to a preset number, the counter switches the control signal such that the ramp signal generator provides the first ramp signal to the PWM signal generating circuit.

In an embodiment of the invention, the control circuit includes a timer. The timer is coupled to the mode detection circuit to receive the mode detection signal. When the dc-dc converting circuit enters the continuous conduction mode from the discontinuous conduction mode, the timer starts counting time, and after the counted time reaches the preset time, the timer switches the control signal such that the ramp signal generator provides the first ramp signal to the PWM signal generating circuit.

In an embodiment of the invention, the ramp signal generator includes a first current source and a second current source. The ramp signal generator generates the first ramp signal according to a current of the first current source, and the ramp signal generator generates the second ramp signal according to the current of the first current source and a current of the second current source.

In an embodiment of the invention, after the preset time, the current of the second current source is progressively decreased.

The control method of the invention is configured to provide a time signal for controlling a dc-dc converting circuit to generate an output voltage. The control method includes the following steps. Whether the dc-dc converting circuit enters a continuous conduction mode from a discontinuous conduction mode is determined to obtain a determination result. If the determination result is yes, the time signal is provided in a preset time according to an error signal related to the output voltage and a second ramp signal. After the preset time, the time signal is provided according to the error signal and a first ramp signal. A slope of the second ramp signal is greater than a slope of the first ramp signal.

Based on the above, in the dc-dc converting circuit and the method for controlling the same proposed by the invention, when the dc-dc converting circuit enters the continuous conduction mode from the discontinuous conduction mode, the ramp signal generating circuit provides the ramp signal with the greater slope to the PWM signal generating circuit, so as to reduce the on time of the low side switch of the output stage. Accordingly, the undershoot amplitude of the output voltage may be reduced and the speed of the output voltage for returning to the stable state may be accelerated.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
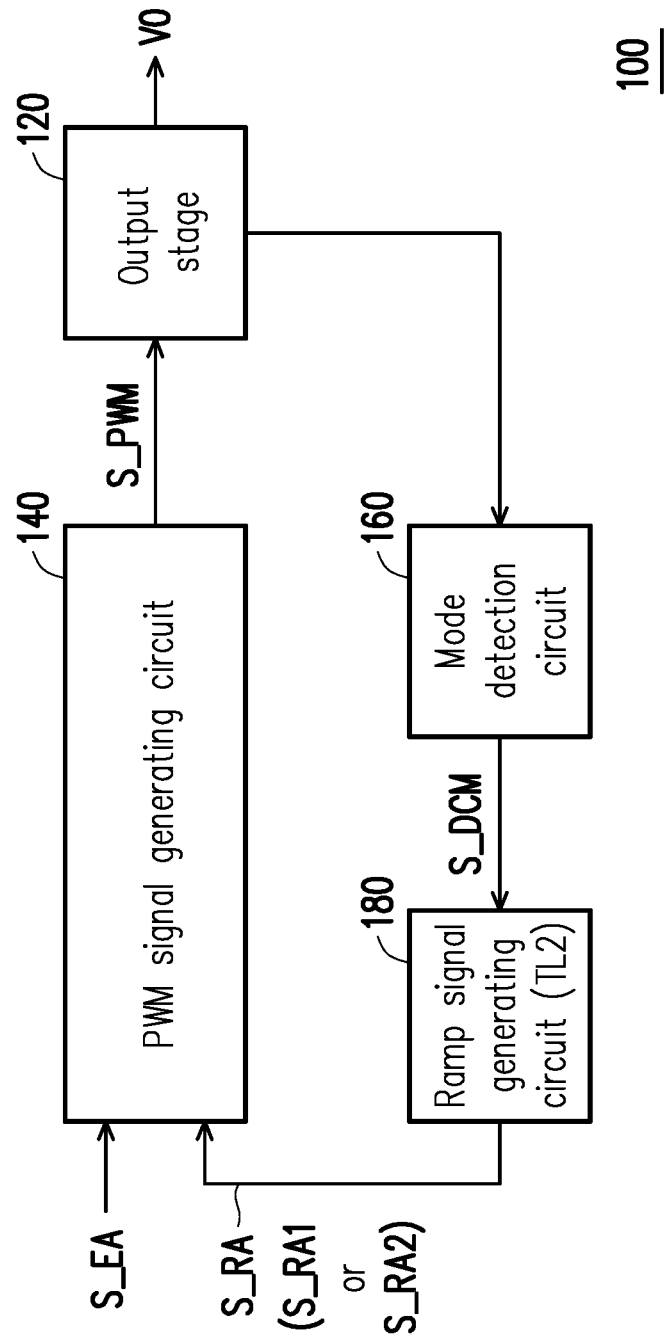
FIG. 1 illustrates a circuit block diagram of a dc-dc converting circuit according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 6:
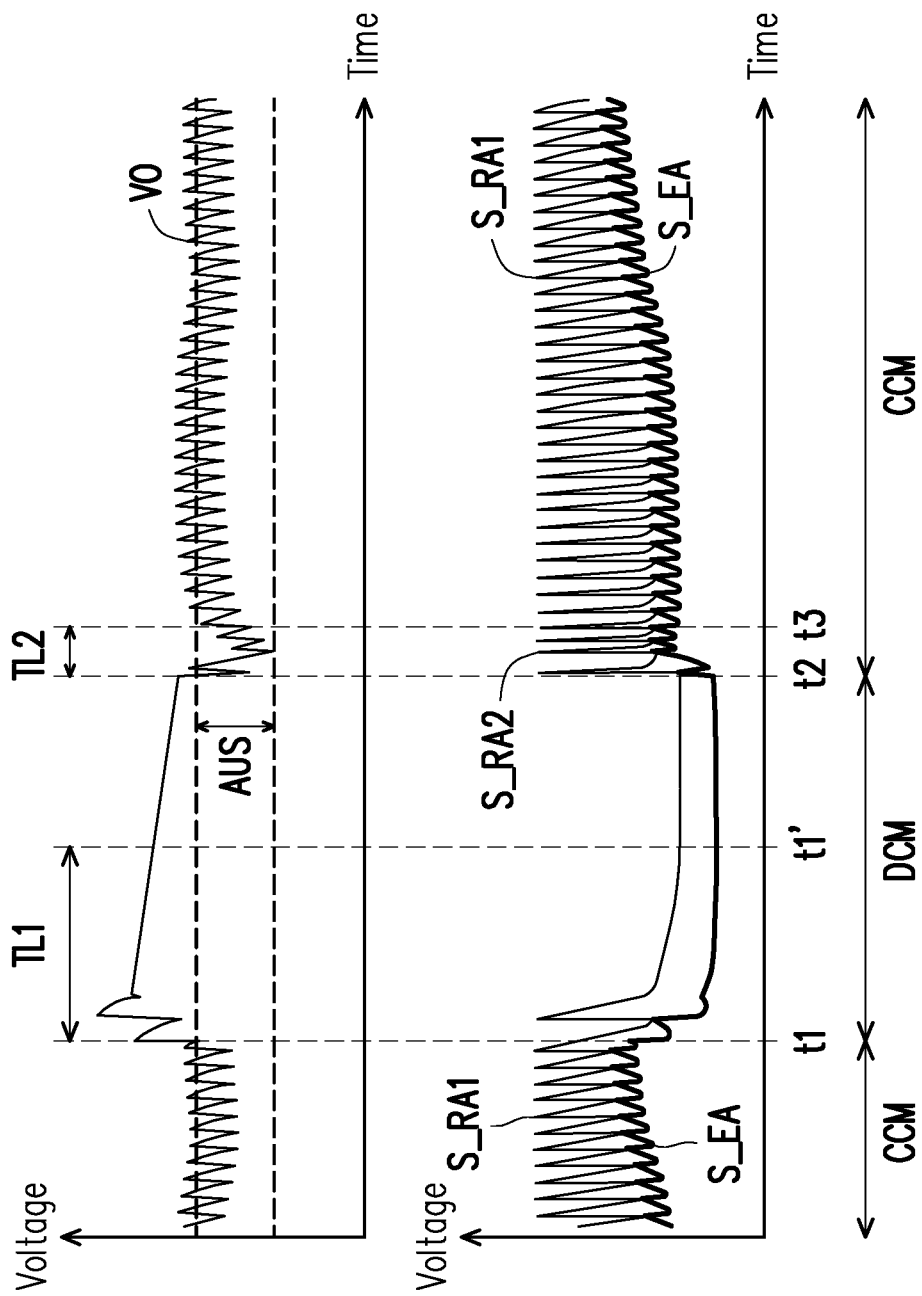
FIG. 6 and FIG. 7 are schematic diagrams illustrating signal waveforms of the dc-dc converting circuit according to an embodiment of the invention.

Referring to FIG. 1 and FIG. 6 together, FIG. 1 illustrates a circuit block diagram of a dc-dc converting circuit according to an embodiment of the invention, and FIG. 6 is a schematic diagram illustrating signal waveforms of the dc-dc converting circuit according to an embodiment of the invention. A dc-dc converting circuit 100 includes an output stage 120, a PWM signal generating circuit 140, a mode detection circuit 160 and a ramp signal generating circuit 180, but the invention is not limited thereto. The output stage 120 provides an output voltage VO. The mode detection circuit 160 is coupled to the output stage 120, and provides a mode detection signal S_DCM. The PWM generating circuit 140 is coupled to the output stage 120, and provides a time signal S_PWM to the output stage 120. The ramp signal generating circuit 180 is coupled to the PWM signal generating circuit 140 and the mode detection circuit 160, and provides a ramp signal S_RA (which may be a first ramp signal S_RA1 or a second ramp signal S_RA2) to the PWM signal generating circuit 140.

In detail, the mode detection circuit 160 can determine an operation mode (e.g., a discontinuous conduction mode (DCM) or a continuous conduction mode (CCM)) of the dc-dc converting circuit 100 according to the output voltage VO or an output current of the output stage 120, and accordingly provide the mode detection signal S_DCM. When the dc-dc converting circuit 100 enters the continuous conduction mode from the discontinuous conduction mode, the ramp signal generating circuit 180 provides the second ramp signal S_RA2 to the PWM signal generating circuit 140 in a preset time TL2 according to the mode detection signal S_DCM. The ramp signal generating circuit 180 provides the first ramp signal S_RA1 to the PWM signal generating circuit 140 after the preset time TL2. A slope of the second ramp signal S_RA2 is greater than a slope of the first ramp signal S_RA1.

In an embodiment of the invention, when the mode detection signal S_DCM indicates that the dc-dc converting circuit 100 operates in the discontinuous conduction mode, the ramp signal generating circuit 180 stops providing the first ramp signal S_RA1 and the second ramp signal SRA_2 to the PWM signal generating circuit 140.

In an embodiment of the invention, the output stage 120 may include a high side switch and a low side switch (not illustrated) serially connected between an input voltage and a ground voltage. The high side switch and the low side switch are controlled by the time signal S_PWM, and a common contact between the high side switch and the low side switch serves as an output terminal of the output stage 120 for providing the output voltage VO. However, the invention is not limited in this regard.

Figure 2:
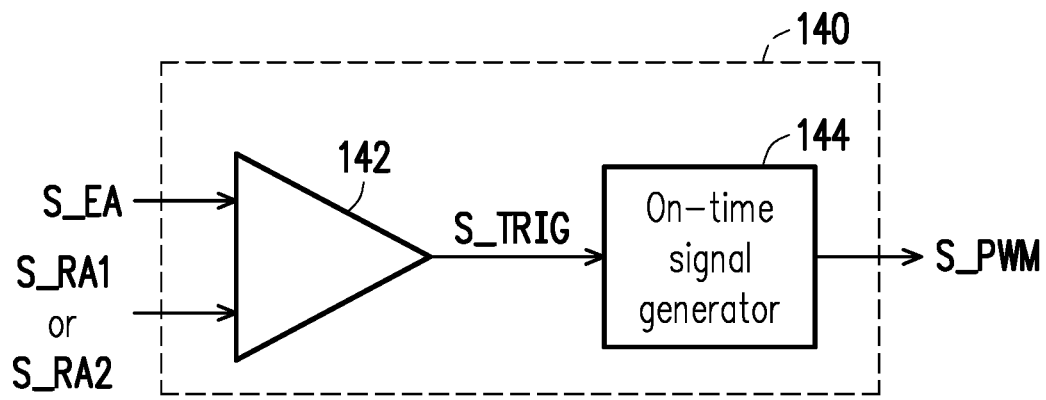
FIG. 2 illustrates a circuit block diagram of a PWM signal generating circuit according to an embodiment of the invention.

As shown by FIG. 2, in an embodiment of the invention, the PWM signal generating circuit 140 may include a comparator 142 and an on-time signal generator 144. The comparator 142 is coupled to the ramp signal generating circuit 180 to receive the first ramp signal S_RA1 or the second ramp signal S_RA2. The comparator 142 further receives an error signal S_EA related to the output voltage VO. The comparator 142 compares the error signal S_EA with the first ramp signal S_RA1 or the second ramp signal S_RA2 to generate a trigger signal S_TRIG. The on-time signal generator 144 is coupled to the comparator 142 to receive the trigger signal S_TRIG, and generates the time signal S_PWM according to the trigger signal S_TRIG. In an embodiment of the invention, the error signal S_EA is, for example, an error amplified signal generated according to comparing the output voltage VO and a reference voltage, but the invention is not limited thereto.

Figure 3:
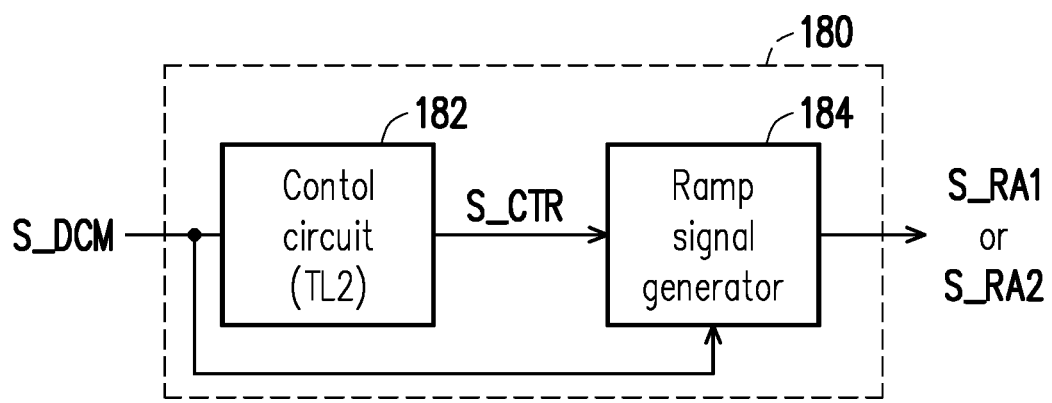
FIG. 3 illustrates a circuit block diagram of a ramp signal generating circuit according to an embodiment of the invention.

In an embodiment of the invention, as shown by FIG. 3, the ramp signal generating circuit 180 may include a control circuit 182 and a ramp signal generator 184. The control circuit 182 is coupled to the mode detection circuit 160 to receive the mode detection signal S_DCM, and generates a control signal S_CTR in response to the mode detection signal S_DCM. The ramp signal generator 184 is coupled to the mode detection circuit 160 to receive the mode detection signal S_DCM, and is coupled to the control circuit 182 to receive the control signal S_CTR. The ramp signal generator 184 generates the first ramp signal S_RA1 or the second ramp signal S_RA2 in response to the mode detection signal S_DCM and the control signal S_CTR.

In detail, when the mode detection signal S_DCM indicates that the dc-dc converting circuit 100 enters the discontinuous conduction mode from the continuous conduction mode, the control circuit 182 generates, for example, the control signal S_CTR of a first level to the ramp signal generator 184. The ramp signal generator 184 can generate the second ramp signal S_RA2 in response to the control signal S_CTR of the first level. However, in the discontinuous conduction mode, the ramp signal generator 184 does not output the second ramp signal S_RA2 to the PWM signal generating circuit 140. On the other hand, when the mode detection signal S_DCM indicates that the dc-dc converting circuit 10 enters the continuous conduction mode from the discontinuous conduction mode, the ramp signal generator 184 outputs the second ramp signal S_RA2 to the PWM signal generating circuit 140 in the reset time TL2. After the preset time TL2, the control circuit 182 generates the control signal S_CTR of a second level to the ramp signal generator 184 so that the ramp signal generator 184 generates and outputs the first ramp signal S_RA1 to the PWM signal generating circuit 140 in response to the control signal S_CTR of the second level.

Figure 4:
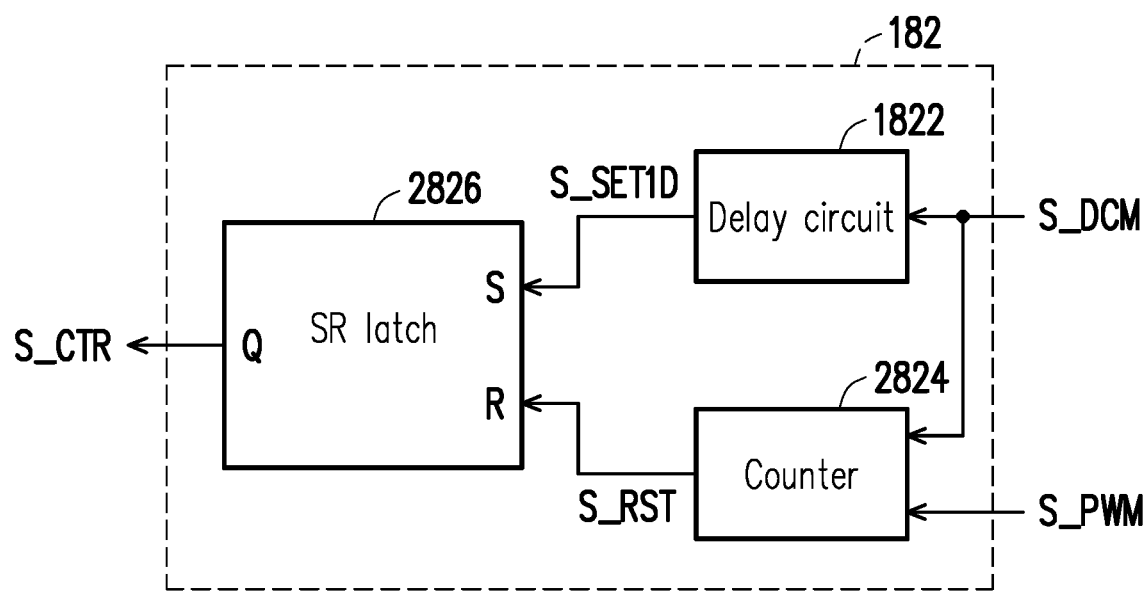
FIG. 4 illustrates a block diagram of a control circuit according to an embodiment of the invention.

In an embodiment of the invention, as shown by FIG. 4, the control circuit 182 may include a delay circuit 1822, a counter 2824 and a SR latch 2826. The delay circuit 1822 receives the mode detection signal S_DCM, and delays the mode detection signal S_DCM by a specific time TL1 to generate and output a set signal S_SET1D to a set terminal S of the SR latch 2826 so that the SR latch 2826 outputs the control signal S_CTR of the first level via its output terminal Q. The counter 2824 receives the mode detection signal S_DCM and is coupled to the PWM signal generating circuit 140 to receive the time signal S_PWM. After the dc-dc converting circuit 100 enters the continuous conduction mode from the discontinuous conduction mode, the counter 2824 counts a number of pulse waves of the time signal S_PWM to determine the preset time TL2, and generates and outputs a reset signal S_RST to a reset terminal R of the SR latch 2826 after the number of pulse waves of the time signal S_PWM is equal to a preset number so that the SR latch 2826 outputs the control signal S_CTR of the second level via the output terminal Q.

In other embodiments of the invention, the delay circuit 1822 may also be omitted in the control circuit 182, and the mode detection signal S_DCM is directly provide to the set terminal S of the SR latch 2826.

Figure 5:
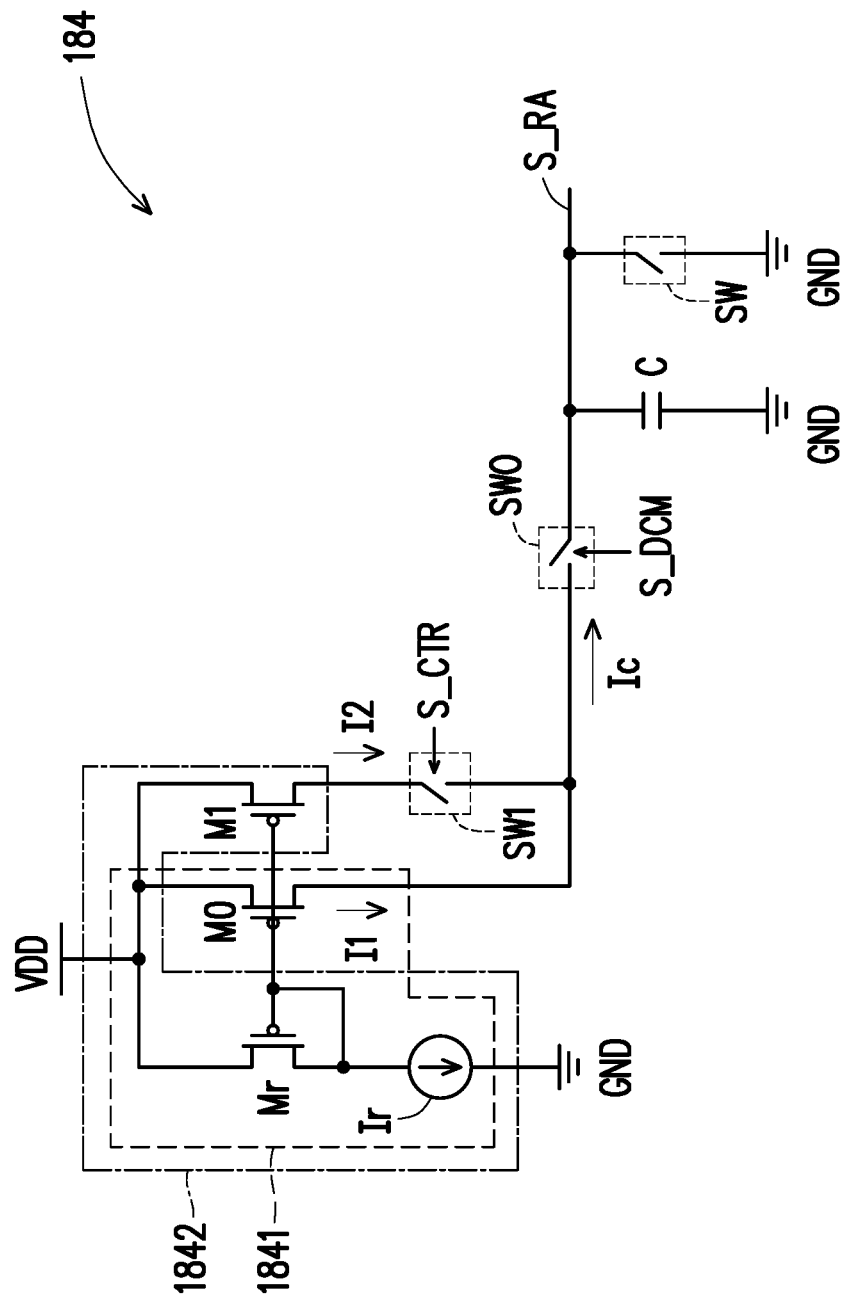
FIG. 5 illustrates a circuit block diagram of a ramp signal generator according to an embodiment of the invention.

In an embodiment of the invention, as shown by FIG. 5, the ramp signal generator 184 may include a first current source 1841 and a second current source 1842. The ramp signal generator 184 generates the first ramp signal S_RA1 according to a current I1 of the first current source 1841, and the ramp signal generator 184 generates the second ramp signal S_RA2 according to the current I1 of the first current source 1841 and a current I2 of the second current source 1842.

More specifically, the ramp signal generator 184 may include transistors Mr, M0 and M1, a reference current source Ir, switches SW, SW0 and SW1 and a capacitor C. The reference current source Ir and the transistors Mr and M0 may be regarded as the first current source 1841, which can generate the current I1 according to the reference current source Ir. The reference current source Ir and the transistors Mr and M1 may be regarded as the second current source 1842, which can generate the current I2 according to the reference current source Ir. The first current source 1841 is coupled to a first terminal of the switch SW0. The switch SW1 is coupled between the second current source 1842 and the first terminal of the switch SW0, and a control terminal of the switch SW1 receives the control signal S_CTR. A second terminal of the switch SW0 is coupled to a first terminal of the capacitor C to provide the ramp signal S_RA (the first ramp signal S_RA1 or the second ramp signal S_RA2), and a control terminal of the switch SW0 receives the mode detection signal S_DCM. A second terminal of the capacitor C is coupled to a ground terminal GND. The switch SW is coupled between the first terminal of the capacitor C and a ground terminal GND. When switch SW1 is turned off, the current I1 serves as a charging current Ic to charge the capacitor C when the switch SW is turned on, and thereby provides the first ramp signal S_RA1. When the switch SW1 is turned on, the currents I1 and I2 serve as the charging current Ic to charge the capacitor C when the switch SW0 is turned on, and thereby provide the second ramp signal S_RA2.

Figure 7:
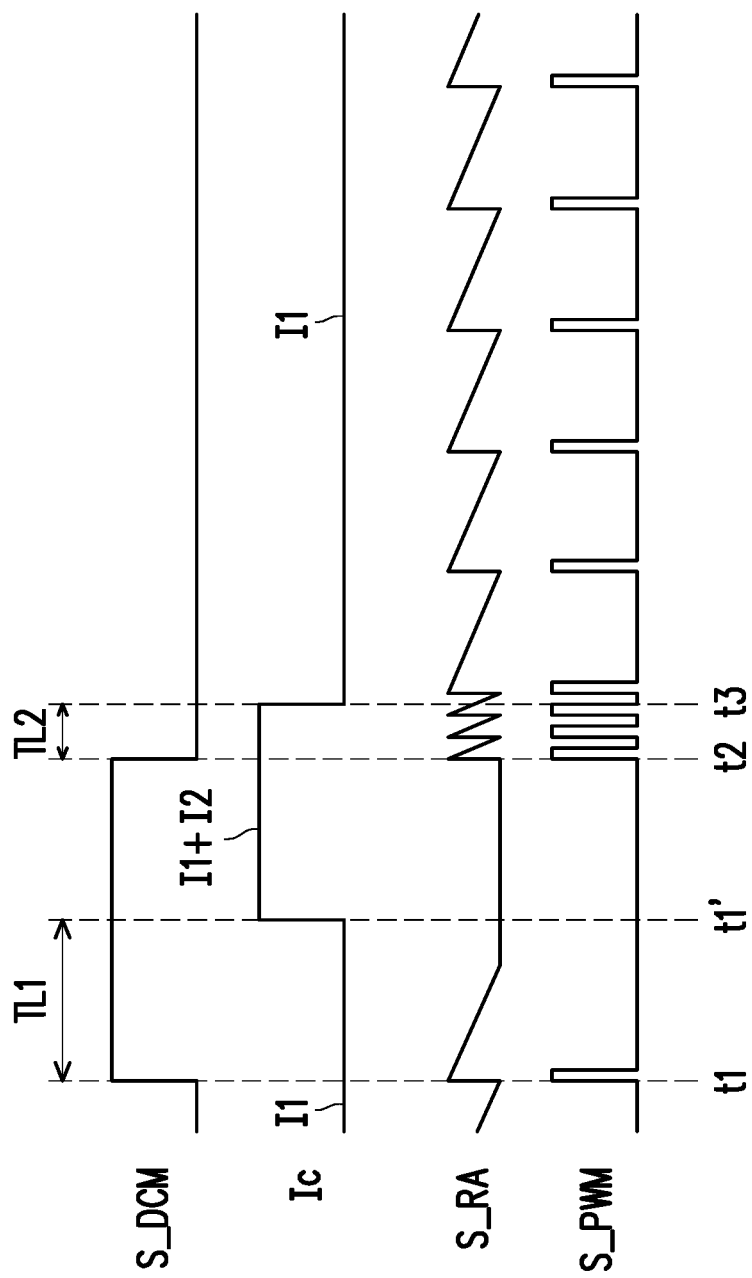

FIG. 6 and FIG. 7 are schematic diagrams illustrating signal waveforms of the dc-dc converting circuit according to an embodiment of the invention. The following description refers to FIG. 1 to FIG. 7. First of all, at a time point t1, because the dc-dc converting circuit 100 enters the discontinuous conduction mode from the continuous conduction mode, the mode detection signal S_DCM switches form logic low level to logic high level. Based on a feedback mechanism of the dc-dc converting circuit 100, a voltage value of the error signal S_EA is decreased, and the PWM signal generating circuit 140 outputs the time signal S_PWM in tri-state to the output stage 120 so that the high side switch and the low side switch in the output stage 120 are both in a turn off state. Therefore, the output voltage VO will be slowly decreased. In addition, the switch SW0 in the ramp signal generator 184 is turned off so that the ramp signal generator 184 stops providing the ramp signal S_RA to the PWM signal generating circuit 140 after the capacitor C is completely discharged. At the time, the counter 2824 of the control circuit 182 is reset by the mode detection signal S_DCM to re-count the number of pulse waves of the time signal S_PWM. However, in the discontinuous conduction mode, because the time signal S_PWM is tri-state, a count value of the counter 2824 is zero.

Next, after the specific time TL1 since the time point t1 (i.e., at a time point t1'), the delay circuit 1822 outputs the set signal S_SET1D to the set terminal S of the SR latch 2826 so that the SR latch 2826 outputs the control signal S_CTR at logic high level via the output terminal Q to turn on the switch SW1 of the ramp signal generator 184 (as illustrated in FIG. 5). At the time, the charging current Ic is a sum of the current I1 and the current I2. Nonetheless, in the discontinuous conduction mode, because the switch SW0 of the ramp signal generator 184 is turned off, the ramp signal generator 184 does not output signals to the PWM signal generating circuit 140.

At a time point t2, because the dc-dc converting circuit 100 enters the continuous conduction mode from the discontinuous conduction mode, the mode detection signal S_DCM switches from logic high level to logic low level so that the switch SW0 of the ramp signal generator 184 of FIG. 5 is turned on. At the time, the charging current Ic (the sum of the current I1 and the current I2) charges the capacitor C to generate and provide the second ramp signal S_RA2 with the greater slope to the PWM signal generating circuit 140. The PWM signal generating circuit 140 compares the error signal S_EA with the second ramp signal S_RA2 to generate the time signal S_PWM. Since the slope of the second ramp signal S_RA2 is greater (as compared to the slope of the first ramp signal S_RA1), a time interval between two adjacent pulse waves on the time signal S_PWM may be shortened so as shorten an on-time of the low side switch in the output stage 120. Accordingly, an undershoot amplitude AUS of the output voltage VO may be reduced and a speed of the output voltage VO for returning to the stable state may be accelerated.

On the other hand, at the time point t2, the counter 2824 in the control circuit 182 detects and counts the number of pulse waves of the time signal S_PWM. When the number of pulse waves of the time signal S_PWM counted by the counter 2824 is equal to the preset number (e.g., three pulse waves, i.e., at a time point t3), the counter 2824 generates the reset signal S_RST to the reset terminal R of the SR latch 2826 so that the SR latch 2826 outputs the control signal S_CTR at logic low level via the output terminal Q to turn off the switch SW1 (illustrated in FIG. 5) of the ramp signal generator 184 and stop providing the current I2. At the time, the charging current Ic (which is the current I1) charges the capacitor C to generate and provide the first ramp signal S_RA1 with the smaller slope to the PWM signal generating circuit 104. The PWM signal generating circuit 140 compares the error signal S_EA with the first ramp signal S_RA1 to generate the time signal S_PWM. As can be understood, since the error signal S_EA will return to a stable waveform at the time point t3, the ramp signal generator 184 provides the first ramp signal S_RA1 with the smaller slope to the PWM signal generating circuit 140 after the time point 3.

Figure 8:
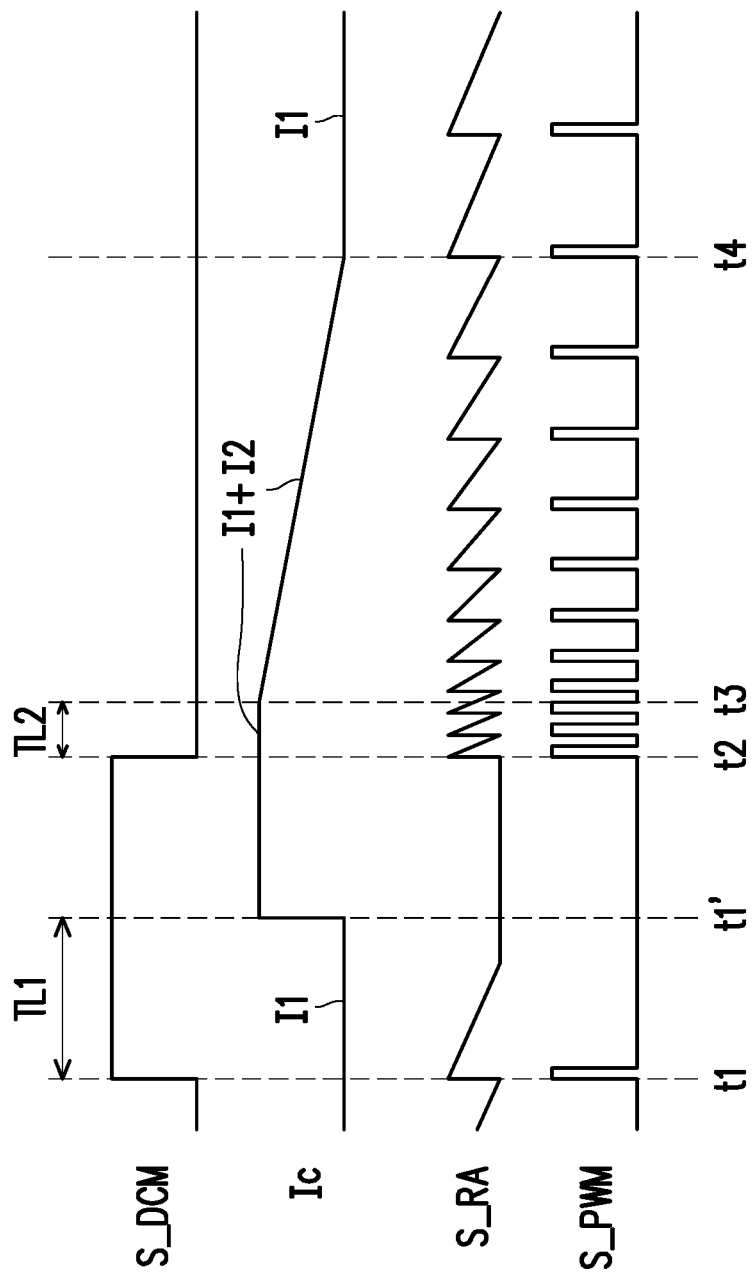
FIG. 8 is a schematic diagram illustrating signal waveforms of the dc-dc converting circuit according to another embodiment of the invention.

With reference to FIG. 8, FIG. 8 is a schematic diagram illustrating signal waveforms of the dc-dc converting circuit according to another embodiment of the invention. The difference between FIG. 8 and FIG. 7 is only in the ramp signal S_RA. In detail, after the time point t3, a slope of the ramp signal S_RA of FIG. 7 is directly decreased from the slope of the second ramp signal S_RA2 to the slope of the first ramp signal S_RA1. On the other hand, in between the time points t3 and t4, a slope of the ramp signal S_RA of FIG. 8 is progressively decreased from the slope of the second ramp signal S_RA2 to the slope of the first ramp signal S_RA1, so the output voltage VO being unstable due to a sharp change of the slope of the ramp signal S_RA before and after the time point t3 can be avoided.

Figure 9:
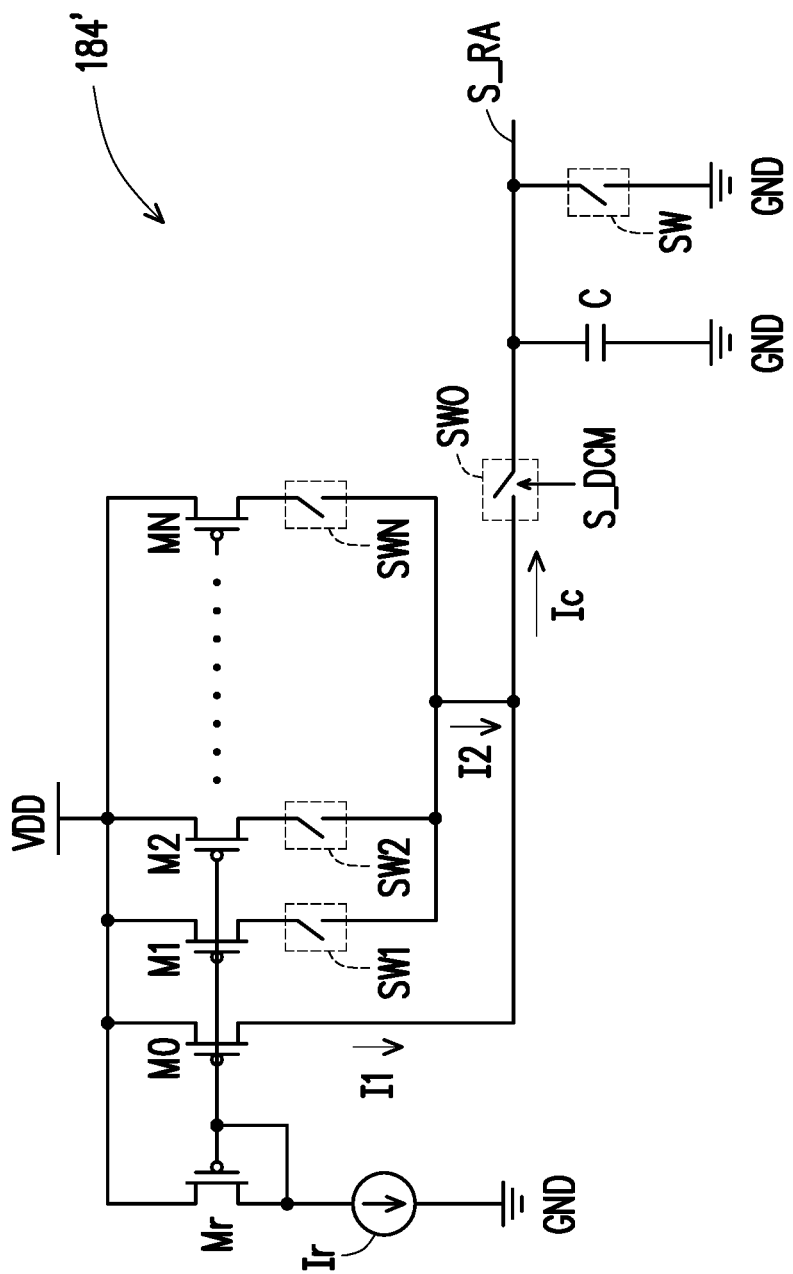
FIG. 9 illustrates a circuit block diagram of a ramp signal generator according to another embodiment of the invention.

With reference to FIG. 9, FIG. 9 illustrates a circuit block diagram of a ramp signal generator according to another embodiment of the invention, which can generate the ramp signal S_RA shown by FIG. 8. Similar to the ramp signal generator 184 of FIG. 5, a ramp signal generator 184' of FIG. 9 also includes the transistors Mr, M0 and M1, the reference current source Ir, the switches SW, SW0 and SW1 and the capacitor C, and their coupling methods and operations can refer to the related description for FIG. 5, which is not repeated hereinafter. In comparison with the ramp signal generator 184 of FIG. 5, the ramp signal generator 184' of FIG. 9 further includes transistors M2 to MN and switches SW2 to SWN.

More specifically, the reference current source Ir and the transistors Mr and M0 may be regarded as the first current source, which generates the current I1 according to the reference current source Ir. When the switches SW1 to SWN are turned off, the current I1 serves as the charging current Ic to charge the capacitor C when the switch SW0 is turned on, and thereby provides the first ramp signal S_RA1, as shown by the ramp signal S_RA after the time point t4 in FIG. 8. The reference current source Ir and the transistors Mr and M1 to MN may be regarded as the second current source, which generates the current I2 according to the reference current source Ir. When the switches SW1 to SWN are all turned on, the current I1 and the current I2 serve as the charging current Ic to charge the capacitor C when the switch SW0 is turned on, and thereby provide the second ramp signal S_RA2, as shown by the ramp signal S_RA between the time points t2 and t3 in FIG. 8. Further, by sequentially turning off the switches SW1 to SWN, the current I2 may be progressively decreased so that the slope of the ramp signal S_RA is progressively decreased from the slope of the second ramp signal S_RA2 to the slope of the first ramp signal S_RA1, as shown by the ramp signal S_RA between the time points t3 and t4 in FIG. 8.

Figure 10:
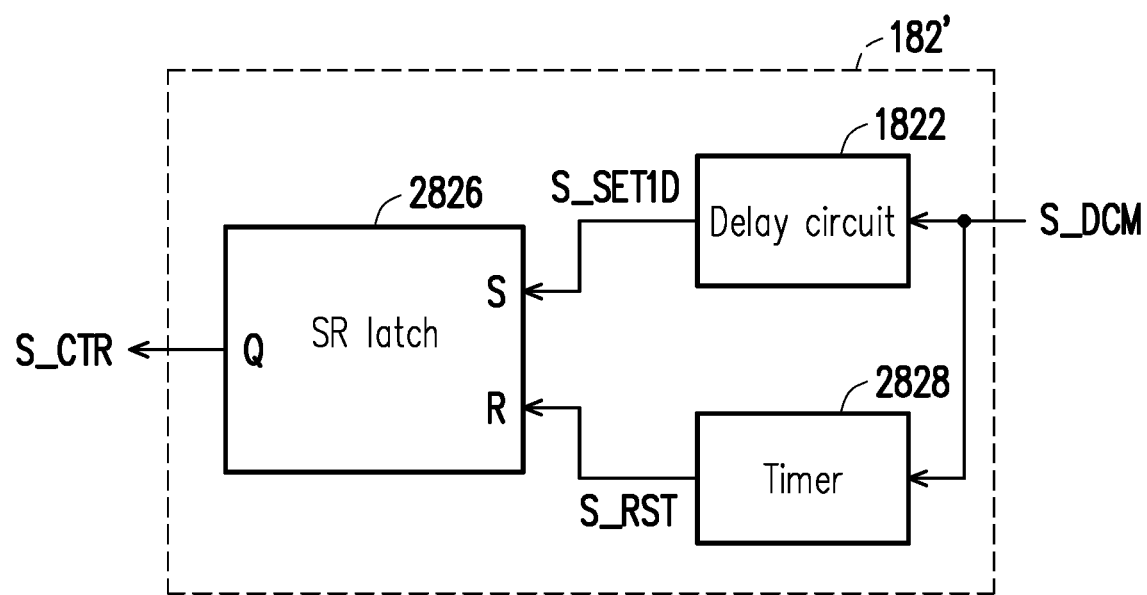
FIG. 10 illustrates a block diagram of a control circuit according to another embodiment of the invention.

With reference to FIG. 10, FIG. 10 illustrates a block diagram of a control circuit according to another embodiment of the invention. A control circuit 182' may include the delay circuit 1822, a timer 2828 and the SR latch 2826. Operations of the delay circuit 1822 and the SR latch 2826 of FIG. 10 are respectively similar to the operations of the delay circuit 1822 and the SR latch 2826 of FIG. 4, and can thus refer to the related description above, which is not repeated hereinafter.

The timer 2828 of the control circuit 182' of FIG. 10 receives the mode detection signal S_DCM. The timer 2828 can start counting time when the dc-dc converting circuit 100 enters the continuous conduction mode from the discontinuous conduction mode (at the time point t2 of FIG. 7), and generate and output the reset signal S_RST to the reset terminal R of the SR latch 2826 after the counted time reaches the preset time TL2 to make the SR latch 2826 switch the control signal S_CTR to the second level via the output terminal Q so that the ramp signal generator 184 generates and outputs the first ramp signal S_RA1 to the PWM signal generating circuit 140.

Figure 11:
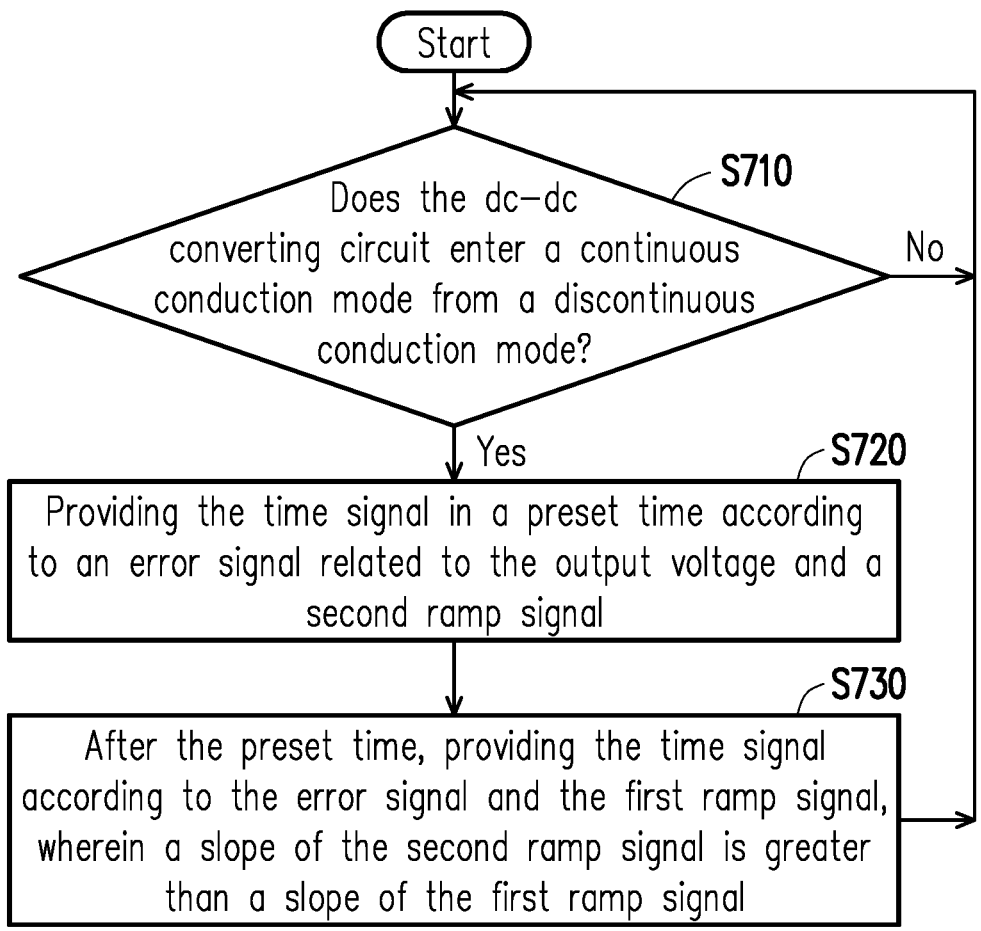
FIG. 11 illustrates a control method according to an embodiment of the invention.

Referring to FIG. 1 and FIG. 11 together, FIG. 11 illustrates a control method according to an embodiment of the invention, which may be used to provide the time signal S_PWM to control the dc-dc converting circuit 100 to generate the output voltage VO, but not limited thereto. The control method includes the following steps. First of all, in step S710, whether the dc-dc converting circuit 100 enters the continuous conduction mode from the discontinuous conduction mode is determined to obtain a determination result. If the determination result in step S710 is "No", step S710 is continuously executed. If the determination result in step S710 is "Yes", the time signal S_PWM is provided in the preset time TL2 according to the error signal S_EA related to the output voltage VO and the second ramp signal S_RA2, as shown by step S720. Next, after the preset time TL2, the time signal S_PWM is provided according to the error signal S_EA and the first ramp signal S_RA1, wherein the slope of the second ramp signal S_RA2 is greater than the slope of the first ramp signal S_RA1, as shown by step S730.

In addition, sufficient teaching, suggestion, and implementation illustration regarding the method for controlling the dc-dc converting circuit according to the embodiments of the invention may be obtained from the descriptions for FIG. 1 to FIG. 10, which are not repeated hereinafter.

In summary, in the dc-dc converting circuit and the method for controlling the same proposed by the embodiments of the invention, when the dc-dc converting circuit enters the continuous conduction mode from the discontinuous conduction mode, the ramp signal generating circuit provides the ramp signal with the greater slope to the PWM signal generating circuit in a preset time, so as to reduce the on-time of the low side switch of the output stage. Accordingly, the undershoot amplitude of the output voltage may be reduced and the speed of the output voltage for returning the stable state may be accelerated. In addition, after the preset time, the ramp signal generating circuit can progressively decrease the slope of the ramp signal, so as to avoid the output voltage being unstable due to the sharp change of the slope of the ramp signal.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A dc-dc converting circuit, comprising:
an output stage, providing an output voltage;
a mode detection circuit, coupled to the output stage, and providing a mode detection signal;
a PWM signal generating circuit, coupled to the output stage, and providing a time signal to the output stage; and
a ramp signal generating circuit, coupled to the PWM signal generating circuit and the mode detection circuit, and providing a first ramp signal or a second ramp signal to the PWM signal generating circuit,
wherein when the dc-dc converting circuit enters a continuous conduction mode from a discontinuous conduction mode, the ramp signal generating circuit provides the second ramp signal to the PWM signal generating circuit in a preset time according to the mode detection signal, and the ramp signal generating circuit provides the first ramp signal to the PWM signal generating circuit after the preset time,
wherein a slope of the second ramp signal is greater than a slope of the first ramp signal.

2. The dc-dc converting circuit according to claim 1, wherein the PWM signal generating circuit comprises:
a comparator, coupled to the ramp signal generating circuit, and receiving an error signal and the first ramp signal or the second ramp signal to generate a trigger signal; and
an on-time signal generator, coupled to the comparator, and generating the time signal according to the trigger signal.

3. The dc-dc converting circuit according to claim 1, wherein when the dc-dc converting circuit operates in the discontinuous conduction mode, the ramp signal generating circuit stops providing the first ramp signal and the second ramp signal.

4. The dc-dc converting circuit according to claim 1, wherein the ramp signal generating circuit comprises:
a control circuit, coupled to the mode detection circuit, and generating a control signal in response to the mode detection signal; and
a ramp signal generator, coupled to the mode detection circuit and the control circuit, and generating the second ramp signal in response to the mode detection signal and the control signal.

5. The dc-dc converting circuit according to claim 4, wherein the control circuit comprises:
a delay circuit, delaying the mode detection signal by a specific time to generate the control signal.

6. The dc-dc converting circuit according to claim 4, wherein the control circuit comprises:
a counter, coupled to the PWM signal generating circuit to receive the time signal,
wherein after the dc-dc converting circuit enters the continuous conduction mode from the discontinuous conduction mode, the counter counts a number of pulse waves of the time signal to determine the preset time, and after the number of pulse waves is equal to a preset number, switches the control signal such that the ramp signal generator provides the first ramp signal to the PWM signal generating circuit.

7. The dc-dc converting circuit according to claim 4, wherein the control circuit comprises:
a timer, coupled to the mode detection circuit to receive the mode detection signal,
wherein when the dc-dc converting circuit enters the continuous conduction mode from the discontinuous conduction mode, the timer starts counting time, and after the counted time reaches the preset time, switches the control signal such that the ramp signal generator provides the first ramp signal to the PWM signal generating circuit.

8. The dc-dc converting circuit according to claim 4, wherein the ramp signal generator comprises a first current source and a second current source, the ramp signal generator generates the first ramp signal according to a current of the first current source, and the ramp signal generator generates the second ramp signal according to the current of the first current source and a current of the second current source.

9. The dc-dc converting circuit according to claim 8, wherein after the preset time, the current of the second current source is progressively decreased.

10. A control method, configured to provide a time signal for controlling a dc-dc converting circuit to generate an output voltage, the control method comprises:
determining whether the dc-dc converting circuit enters a continuous conduction mode from a discontinuous conduction mode to obtain a determination result;
if the determination result is yes, providing the time signal in a preset time according to an error signal related to the output voltage and a second ramp signal; and
after the preset time, providing the time signal according to the error signal and a first ramp signal,
wherein a slope of the second ramp signal is greater than a slope of the first ramp signal.

* * * * *